United States Patent [19]

Orban

[11] Patent Number: 5,444,788
[45] Date of Patent: Aug. 22, 1995

[54] AUDIO COMPRESSOR COMBINING FEEDBACK AND FEEDFOWARD SIDECHAIN PROCESSING

[75] Inventor: Robert A. Orban, Belmont, Calif.

[73] Assignee: AKG Acoustics, Inc., San Leandro, Calif.

[21] Appl. No.: 116,496

[22] Filed: Sep. 3, 1993

[51] Int. Cl.⁶ ............................................. H03G 7/00
[52] U.S. Cl. .................................. 381/106; 333/14
[58] Field of Search .............................. 381/106–108, 381/104, 68.4, 68; 333/14; 455/72

[56] References Cited

U.S. PATENT DOCUMENTS 4,562,591 12/1985 Stikvoort ............................ 381/106
4,947,133 8/1990 Thomas ............................... 381/107

OTHER PUBLICATIONS

"The Dynamic Characteristics of Limiters for Sound Programme Circuits", Research Report No. EL-5, UDC 534.86: 621.395.665.1, 1967/13, *The British Broadcasting Corporation Engineering Division*.

*Primary Examiner*—Curtis Kuntz
*Assistant Examiner*—Ping W. Lee
*Attorney, Agent, or Firm*—Blakely, Sokoloff, Taylor & Zafman

[57] ABSTRACT

An audio compressor having both a feedback compressor and a feedforward compressor. The feedback compressor operates so as to provide envelope detection. A sidechain processor which receives an input from the feedback path includes a non-linear low-pass filter and a non-linear amplifier. The output of this processor provides the gain-control signal for the feedforward compressor. The main audio path is through the feedforward compressor.

10 Claims, 1 Drawing Sheet

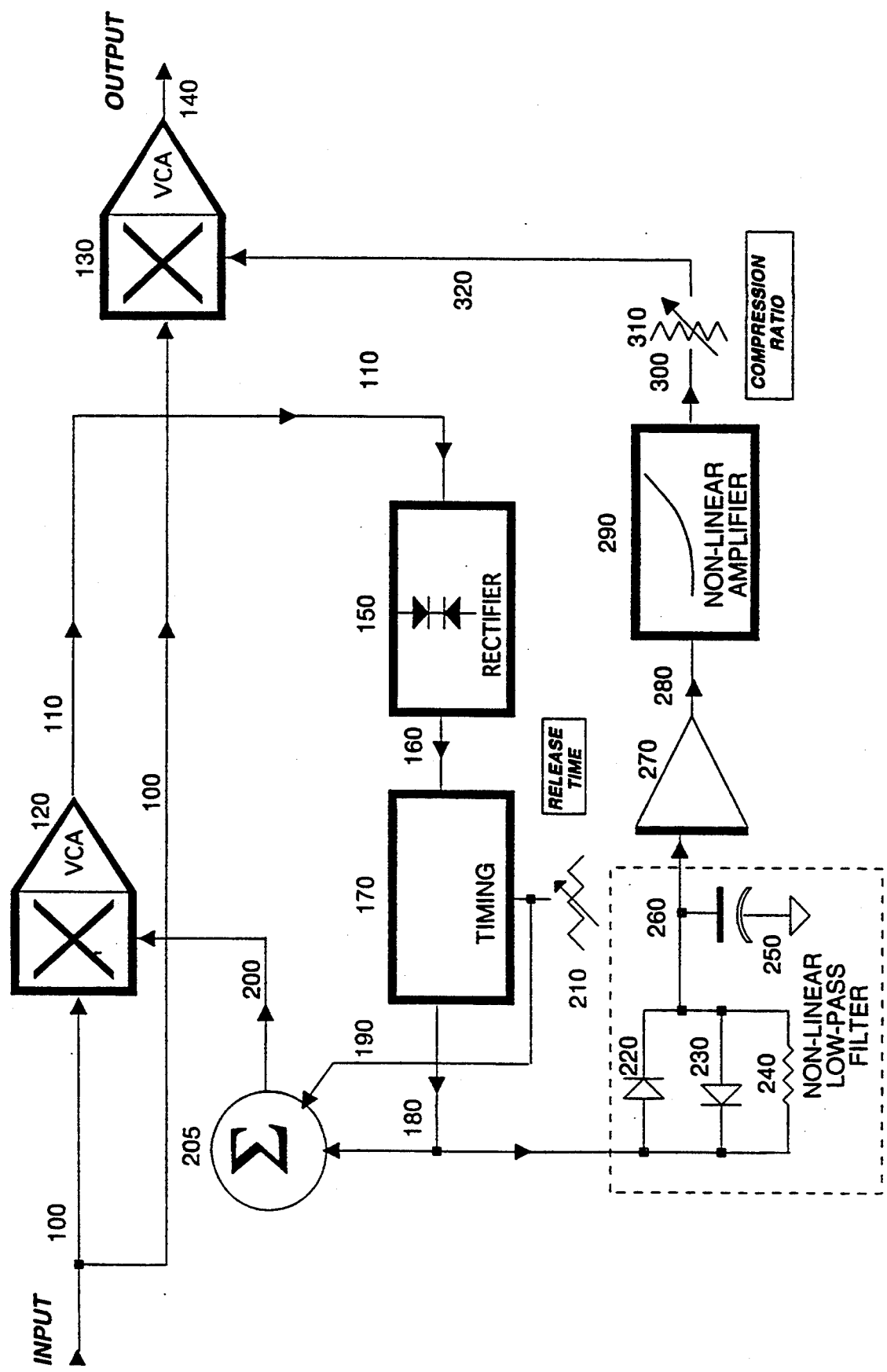

AUDIO COMPRESSOR COMBINING FEEDBACK AND FEEDFOWARD SIDECHAIN PROCESSING

BACKGROUND OF INVENTION

1. Field of the Invention

The invention relates to the field of audio compressors.

2. Prior Art

Compressors adaptively adjust their gain to automatically reduce the dynamic range of an audio signal applied to their inputs. Traditionally, compressors use either feedback or feedforward control. In a feedback compressor, the gain-controlled output of the compressor feeds a full-wave rectifier or comparator with threshold level, either of which responds to any signal exceeding the "threshold level of compression." If the envelope of the audio at the compressor's output exceeds the threshold level, the rectifier or comparator sends a signal into a smoothing or integrating circuit, which outputs a signal that causes gain reduction. If the smoothing circuit is a true integrator, it will continue to charge until the output of the compressor no longer exceeds the threshold level of compression, at which point charging will stop. (The time required for this charging to fully occur is usually called the "attack time" of the compressor.)

If the input audio level decreases, a release circuit permits the integrator to discharge, increasing the gain until the compressor's output is once again at threshold level, or until the compressor has achieved its maximum quiescent gain. The time constant of this discharge is usually called the "release time."

In a feedforward compressor, the input of the compressor is connected in parallel with the input of an envelope detector, such as an average or r.m.s. detector. The output of the envelope detector is applied to a thresholding circuit with the output of this circuit controlling the gain of the compressor. Usually, the output of the envelope detector is proportional to the logarithm of the envelope ("linear in dB"), and the gain (in dB) of the gain determining circuit (usually a voltage-controlled amplifier or "VCA") is directly proportional to the signal applied to its gain-controlled port. By choosing the constant of proportionality between the output of the thresholding circuit and the input of the VCA, one can arbitrarily set the compression ratio (the slope of the output level versus input level characteristic, in dB).

In any compressor, the dynamic characteristics of the envelope detector or integrator (such as attack and release time constants) must be matched to the psychoacoustic requirements of the ear to minimize audible artifacts. Because in a feedforward compressor it is easy to process the output of the envelope detector without compromising the stability of the control loop, such designs have become very popular. However, the available envelope detectors (such as average or r.m.s. detectors) have tended to introduce obvious artifacts.

Some designs of feedback compressors have a dynamic response smoother than most commercial feedforward compressors. A significant amount of this smoothness results from the unique dynamic characteristics created by the feedback control. However, these feedback designs have two important limitations. First, it is difficult to smooth the output of the integrator well enough to prevent some audible distortion. This distortion is caused by modulation effects when the gain-control signal is multiplied by the audio. Second, it is inconvenient to create a compression ratio of less than infinity because the feedback always attempts to hold the output level of the compressor equal to the threshold level of compression. (See British Broadcasting Corporation Engineering Division, "The dynamic characteristics of limiters of sound programme circuits," Research Report No. EL-5 (1967), serial number 1967/13.)

SUMMARY OF THE INVENTION

An audio compressor having a first and a second voltage controlled amplifiers (VCAs) both of which receives an input audio signal. The first VCA operates as a pilot device with its output coupled to a sidechain processor. This processor includes a rectifier, non-linear low-pass filter and a non-linear amplifier. The gain of the first VCA is "decilinear"; that is, the gain of this pilot VCA in dB is linearly proportional to the signal from the sidechain processor that controls this VCA. Thus the pilot VCA operates generally as a feedback compressor provided the input level exceeds the threshold level of compression. The gain-control signal developed by the feedback compressor, after processing, is applied to the gain-control port of the second VCA whose gain vs. control signal characteristic is well-matched to the pilot VCA within the feedback compressor. The output of the pilot VCA thus serves only as a "pilot signal"; the program audio passes through the second VCA, to provide the output of the compressor. In essence, what results is a feedforward compressor in which the average or r.m.s. detector is replaced with a feedback compressor, used as an envelope detector.

BRIEF DESCRIPTION OF THE DRAWING

The drawing is a block diagram of the presently preferred embodiment of the invention.

DETAILED DESCRIPTION OF THE INVENTION

An audio compressor having a feedback compressor operated as a pilot device and a feedforward compressor is described. In the following description numerous specific details are set forth such as part numbers in order to provide a thorough understanding of the present invention. It will be obvious, however, to one skilled in the art that the present invention may be practiced without these specific details. In other instances, well-known devices have not been set forth in detail in order not to unnecessarily obscure the present invention in detail.

Referring to the drawing, the input audio signal on line 100 feeds voltage-controlled amplifier (VCA) 120 and VCA 130. VCA 120 is the "pilot" VCA, while VCA 130 is the VCA in the main audio path. The output of VCA 130 appears on line 140, and is the output of the compressor. Both VCAs can be part number uPC1252H2, manufactured by NEC.

Rectifier with threshold circuit 150 receives the output of VCA 120 on line 110. An ordinary threshold level circuit used with feedback compressors is used as part of the rectifier. (Rectifier 150 could instead use a comparator, like the LM339, manufactured by National Semiconductor.) Timing circuit 170 receives the output of rectifier 150 and integrates this signal to determine the attack time, release time, and dynamic characteristics of the feedback compressor. This timing circuit can be similar to the one disclosed in FIG. 7 of my U.S. Pat. No. 4,208,548.

Summer 205 combines the output of timing circuit 170 with a DC signal derived from the RELEASE TIME control 210. The polarity of this signal is chosen to cause the gain of VCA 120 to increase when the release time decreases. The feedback from the timing circuit 170, in turn, causes the signal on line 180 to change to oppose the signal on line 190. The signal on line 180 therefore changes in the direction that causes more gain reduction in VCA 120.

The present invention solves the problem of output level variation when release time is adjusted. In a conventional feedback compressor, when the release time gets short, the compression ratio decreases, because the level detector must supply an average current into the smoothing circuit equal to the average current removed from the smoothing circuit by the release circuit. This means that the average level applied to the level detector must increase with decreases in release time, so that the waveform is above the threshold level long enough to supply the requisite attack current.

Ignoring for the moment the other signal processing between lines 180 and 320, the signal change on line 180 causes the gain of VCA 130 to decrease compared to what its gain would have been if there had been no signal on line 190. Therefore, the signal on line 190 compensates for the increase in level associated with fast release times by decreasing the gain of VCA 130 as the release time decreases. The major advantage of this technique by comparison to causing the RELEASE TIME control to directly decrease the gain of VCA 130 (by, for example, summing the signal on line 190 in reverse polarity with the signal on line 320) is that the gain of VCA 130 is unaffected when no gain reduction occurs. Thus, there is no interaction between the RELEASE TIME control and the static gain of the compressor. Consequently, VCA 120, rectifier 150, timing circuit 170, and summation means 205 form a somewhat conventional feedback compressor, except for the coupling between the RELEASE TIME control 210 and the gain of VCA 120. In the currently preferred embodiment, the gain of VCA 120 is proportional to the exponential of the signal on line 200. (This characteristic is commonly called "decilinear" because the gain of the VCA in dB is linearly proportional to the signal on line 200.) The gain control voltage on line 180 is proportional to the gain in dB of VCA 120.

The non-linear low-pass filter 210 is coupled to line 180; it receives the signal on line 180 and smooths it. The filter 210 comprises the diodes 220 and 230, resistor 240, and capacitor 250. In the currently preferred embodiment, resistor 240 is 10 megohms and capacitor 250 is 100 nanofarads. Diodes 220 and 230 are part number 1N4148. Inherent in this filter is that its attack and decay characteristics non-linearly depend on the amplitude of the input signal.

If variations in the envelope of the signal on line 180 are small, capacitor 250 charges slowly through resistor 240 to the average value of the signal on line 180. If a large variation in the envelope of the signal on line 180 appears, it turns on diode 220 or 230, causing the change to pass quickly through to line 260. Thus the circuit causes the compressor to respond quickly to large changes in level and slowly to small changes, minimizing any undesired audible cross-modulation between the control voltage and the program audio. Note that such non-linear low-pass filter circuits are known in the prior art. A similar circuit is used by Dolby to smooth the control voltage in a feedback compressor used in the original Dolby Type-A noise reduction system model 301. The system remained stable because the loop gain in the Dolby compressor is quite low.

Amplifier 270 buffers the output of the non-linear low-pass filter 210. Non-linear amplifier circuit 290 receives the output of amplifier 270 and processes it to create a "soft-knee" compression characteristic. This circuit has very low gain for small input signals. Its gain increases with applied signal level until it receives a signal corresponding to an audio level at the compressor input approximately 20 dB above the threshold level of compression. For larger input signals, the amplifier's gain remains constant. An appropriate circuit to realize the function in block 290 is found in the dbx Model 166, manufactured by AKG Acoustics Inc.

Scaling the control signal applied to a decilinear VCA changes the compression ratio. Thus non-linear amplifier 290 causes the compression ratio to increase with gain reduction as the input signal increases from 0 to 20 dB above the compression threshold. The ratio stays constant for further increases in input level.

COMPRESSION RATIO control 310 receives the output of the non-linear amplifier 290, scaling the compression ratio curve generated by non-linear amplifier 290 according to the desires of the operator. The output of the COMPRESSION RATIO control on line 320 is then applied to the gain-control port of VCA 130.

The invention achieves substantial benefits even if all of the signal processing between lines 180 and 320 is not used. For example, COMPRESSION RATIO control 320 could be omitted, and the gain in the sidechain adjusted so that signals more than 20 dB above threshold level would cause infinity:1 compression ratio.

If non-linear amplifier 290 were omitted, the compression would have a "hard-knee" characteristic, which might be preferred in some applications such as protection limiting, where the compressor is ordinarily operated below threshold level and only produces gain reduction to protect against level-setting errors prior to the compressor.

If the non-linear low-pass filter 210 were omitted, the audio would not be as smooth or clean, but the system would retain the advantage of permitting the compression ratio to be changed easily, and producing a "soft-knee" characteristic.

In the present invention, the gain of the pilot VCA (i.e., the VCA within the feedback loop) is coupled to the release time control and increases when the release time decreases. This forces the feedback loop to increase the gain reduction in the pilot VCA and applies additional gain reduction to the VCA in the main audio path. By correctly choosing the amount of gain increase as a function of release time, one can force the additional gain reduction signal to approximately cancel the effect of the increased output level in the feedback compressor caused by a faster release time.

Another way to achieve the goal of preventing the output level from increasing when the release time is made fast involves controlling the threshold level within rectifier 150. The release time control signal is coupled to rectifier 150 such that speeding up the release time decreases the threshold level of this rectifier, and thus, the threshold level of compression. This provides more compression for any input above the threshold level, increasing the control voltage on line 180 and achieving essentially the same goal as increasing the gain of VCA 120.

Thus we see that the present invention has all of the advantages of a feedforward compressor while retaining the dynamic smoothness of an optimized feedback compressor. Further, it greatly reduces the tendency of the output level to change with changes in the release time control.

I claim

1. An audio compressor comprising;
    a feedback compressor coupled to receive an input audio signal and having a gain-control signal in a feedback path between an output of the feedback compressor and a gain-control port of the feedback compressor, the feedback compressor operated so as to provide envelope detection of the input audio signal; and
    a feedforward compressor controlled by the gain-control signal of the feedback compressor after the gain-control signal has been passed through a non-linear low-pass filter and werein the non-linear low-pass filter has an attack and decay characteristic non-linearly dependent on the amplitude of a signal input thereto;
    said feedback compressor using a first voltage controlled amplifier, the gain of which is proportional to the exponential of the gain-control signal, and wherein said feedforward compressor uses a second voltage controlled amplifier having substantially the same characteristics as the first voltage controlled amplifier.

2. The compressor defined by claim 1 including a non-linear variable gain amplifier coupled to the filter.

3. The compressor defined by claim 2 wherein a feedback path of the feedback compressor includes a rectifier having a threshold level.

4. The compressor defined by claim 3 wherein the feedback path include a timing means for controlling attack time of the feedback compressor.

5. The compressor defined by claim 4 wherein the timing means also controls release time of the feedback compressor.

6. The compressor defined by claim 2 wherein a feedback path of the feedback compressor includes a comparator.

7. The compressor defined by claim 1 wherein the gain-control signal after passing through the non-linear filter is coupled to a non-linear amplifier before controlling the feedforward compressor.

8. The compressor defined by claim 7 wherein the non-linear amplifier includes gain control.

9. An audio compressor comprising:
    a first voltage-controlled amplifier (VCA) coupled to receive an input audio signal;
    a second VCA having substantially the same characteristics as the first VCA coupled to receive the input audio signal;
    the first VCA providing an output signal coupled to a sidechain processor comprising a smoothing means for smoothing a signal and a non-linear amplifier;
    the sidechain also including a non-linear filter having an attack and decay characteristic non-linearly dependent on the amplitude of a signal input thereto;
    the sidechain processor providing a control signal for controlling the second VCA;
    the output signal of the first VCA being feedback to control the gain of the first VCA the gain of said first VCA being proportional to the exponential of the output signal; and
    the second VCA providing a compressed audio output signal.

10. The compressor defined by claim 9 wherein the smoothing means includes a non-linear low-pass filter.

* * * * *